United States Patent [19]

Thompson, Sr.

[11] Patent Number: 5,740,730
[45] Date of Patent: Apr. 21, 1998

[54] APPARATUS FOR DEPOSITING SOLDER AND ADHESIVE MATERIALS ONTO A PRINTED CIRCUIT BOARD

[75] Inventor: Curtis C. Thompson, Sr., Meridian, Id.

[73] Assignee: Micron Electronics, Inc., Nampa, Id.

[21] Appl. No.: 706,448

[22] Filed: Sep. 3, 1996

[51] Int. Cl.$^6$ ............................. B05C 17/06; B41L 13/12
[52] U.S. Cl. ........................ 101/127; 118/213; 118/406; 427/96; 427/282; 228/180.22; 228/175; 101/115
[58] Field of Search ........................ 101/127, 115, 101/128.4, 128.21; 228/180.22, 175; 118/213, 406; 427/96, 282

[56] References Cited

U.S. PATENT DOCUMENTS

| | | | |
|---|---|---|---|
| 1,526,266 | 2/1925 | De Smet | 101/115 |
| 2,084,827 | 6/1937 | Schwartz et al. | 101/115 |
| 2,624,294 | 1/1953 | Seagren | 101/115 |
| 3,442,207 | 5/1969 | Johnson | 101/127 |
| 4,208,005 | 6/1980 | Nate et al. | 228/175 |
| 4,791,006 | 12/1988 | Galvagni et al. | 101/127 |
| 4,872,261 | 10/1989 | Sanyal et al. | 101/127 |
| 4,919,969 | 4/1990 | Walker | 427/282 |
| 5,254,362 | 10/1993 | Shaffer et al. | 427/96 |
| 5,368,883 | 11/1994 | Beaver | 427/96 |
| 5,436,028 | 7/1995 | Becher et al. | 427/96 |
| 5,593,080 | 1/1997 | Teshima et al. | 101/127 |
| 5,639,010 | 6/1997 | Todd et al. | 228/175 |

Primary Examiner—Edgar S. Burr
Assistant Examiner—Leslie Grohusky
Attorney, Agent, or Firm—Seed and Berry LLP

[57] ABSTRACT

An method and apparatus for forming adhesive and solder pads on a printed circuit board to surface mount electrical components to the board. In accordance with an embodiment of the invention, a solder paste is deposited onto the printed circuit board through a first stencil that has a plurality of first openings. The solder paste forms a plurality of solder pads on the board. A second stencil is then positioned on the printed circuit board. The second stencil has a plurality of second openings, and a recess in its bottom face configured to receive the plurality of solder pads. After the second stencil is positioned on the printed circuit board so that the solder pads are received in the recess on the bottom face of the second stencil, an adhesive material is deposited onto the board through the second openings of the second stencil to form a plurality of adhesive pads on the board.

20 Claims, 5 Drawing Sheets

APPARATUS FOR DEPOSITING SOLDER AND ADHESIVE MATERIALS ONTO A PRINTED CIRCUIT BOARD

TECHNICAL FIELD

The present invention relates to surface mounting electrical components onto a printed circuit board, and more particularly to depositing solder and adhesive materials onto the printed circuit board.

BACKGROUND OF THE INVENTION

Printed circuit boards ("PCBs") with electrical components are used in computers, communications equipment, televisions, and many other products. Through-hole electrical components are generally attached to the top side of PCBs using through-hole processes, while surface mount components are attached to both sides of PCBs using surface mounting processes. In attaching the electrical components to the PCBs, it is important to maximize the throughput of finished PCBs and securely attach the electrical components to the PCBs.

In typical through-hole mounting processes, the leads of the electrical components are passed through holes in the PCB so that the ends of the leads extend beyond the bottom side of the PCB. The ends of the leads are then soldered to the bottom side of the PCB by a solder wave in which molten solder flows across the bottom side of the PCB. The molten solder fills the voids between the component leads and the through holes to form conductive bonds between the leads and contact points on the PCBs.

In typical bottom side surface mounting processes, the electrical components are pressed against a solder and/or an adhesive deposited onto the bottom side of the PCBs. One type of solder used to surface mount components is a solder paste deposited onto the bottom side of the PCB in a pattern of solder pads. Although solder pastes have high strength at the operating temperatures of the PCBs, they reflow at high temperatures. As a result, many of the components mounted to the bottom side of a PCB with only a solder paste fall off in subsequent solder waves used to through-hole mount other components to the top side of the PCB. Adhesives used to surface mount components are generally a glue deposited onto the bottom side of the PCB in a pattern of glue pads. Although typical glues do not reflow in solder waves, they have poor strength at normal operating temperatures. As a result, prior to soldering component parts to the PCB with a solder wave, the components mounted to the bottom side of a PCB with only a glue are subject to falling off under typical forces that occur during handling and transportation of unfinished product. Therefore, it is desirable to mount components to the bottom side of a PCB with a combination of solder and glue pads.

Conventional solder and glue surface mounting processes deposit a first pattern of solder pads using a stencil and a second pattern of glue pads with mechanical syringes. The syringes generally deposit the glue pads at a rate of 2–7 pads/second, and as high as a rate of 10 pads/second. Since PCBs often require 1,200 or more glue pads, it takes 2–10 minutes to deposit the glue pads in a second pattern on the bottom side of a PCB.

One problem with conventional methods for depositing solder and glue pads on the bottom side of a PCB is that it is time-consuming to place glue pads on PCBs. Even the fast syringes that deposit the glue pads at a rate of 10 pads/second require a significant amount of time to pattern a whole PCB. As a result, conventional methods for depositing glue pads next to solder pads reduce the throughput of manufacturing processes. Therefore, it would be desirable to develop a faster method and apparatus for depositing the solder and glue pads onto the bottom side of a PCB.

Another problem with conventional methods for depositing both solder and glue on the bottom side of a PCB is that it is sometimes difficult to deposit a consistent and adequate amount of glue at each point. In general, the glue is deposited into a hemispherical pad between two rectilinear solder pads. The volume of adhesive is accordingly limited to a hemisphere having a diameter that is less than the distance between the solder pads. Thus, when the solder pads are positioned relatively close together, it is difficult to deposit an adequate amount of glue between the solder pads without forming additional glue pads at the expense of throughput. Therefore, it would be desirable to develop a method and device for depositing more glue in the space between solder pads without reducing throughput.

SUMMARY OF THE INVENTION

The present invention is a method and an apparatus that forms adhesive and solder pads on a printed circuit board to surface mount electrical components to the board. In an embodiment of a method in accordance with the invention, a first material is deposited onto the printed circuit board through a first stencil that has a plurality of first openings. The first material forms a plurality of first pads on the board. A second stencil is then positioned on the printed circuit board. The second stencil has a plurality of second openings and at least one recess in its bottom face configured to receive the plurality of first pads. After the second stencil is positioned on the printed circuit board so that the first pads are received in the recess on the bottom face of the second stencil, a second material is deposited onto the board through the second openings of the second stencil. The second material forms a plurality of second pads on the board. In a preferred embodiment, the first material is a solder paste forming a plurality of solder pads and the second material is a glue forming a plurality of glue pads.

In another embodiment of the invention, a stencil set has a first stencil with a thickness $T_1$ and a plurality of first openings arranged in a first pattern. The stencil set also has a second stencil with a thickness $T_2$ greater than the thickness $T_1$ of the first stencil, a plurality of recesses arranged in the first pattern, and a plurality of second openings. The recesses in the second stencil have shapes corresponding to the shapes of the first openings, and the recesses have depths D at least as great as the thickness $T_1$ of the first stencil. In operation, a plurality of first pads are deposited onto a printed circuit board through the first openings of the first stencil to a height approximately equal to the thickness $T_1$. The second stencil is then positioned over the printed circuit board so that the first pads are positioned in the recesses, and plurality of second pads are deposited onto the printed circuit board through the second stencil.

DETAILED DESCRIPTION OF THE INVENTION

The present invention is a fast, accurate apparatus and method for depositing solder and glue compounds on PCBs to form surface mounting contact points. An important aspect of an embodiment of the invention is to deposit a solder compound through a first stencil that has a plurality of first openings to form a plurality of solder pads on the PCB in a first pattern. Another important aspect of an embodiment of the invention is to deposit a glue compound through a second stencil that has a plurality of second openings and a recess in its bottom face. The second openings are preferably arranged in a second pattern to form a plurality of glue pads between pairs of solder pads, and the recess in the second stencil is configured to receive the plurality of solder pads previously deposited onto the PCB. By providing a recess on the bottom face of the second stencil that receives previously deposited soldered pads, the glue compound may be deposited onto the PCB with a stencil in less time than conventional syringe depositing processes. FIGS. 1–9B, in which like reference numbers refer to like components and features throughout the various figures, illustrate embodiments of apparatuses and methods in accordance with the invention.

Figure 1:
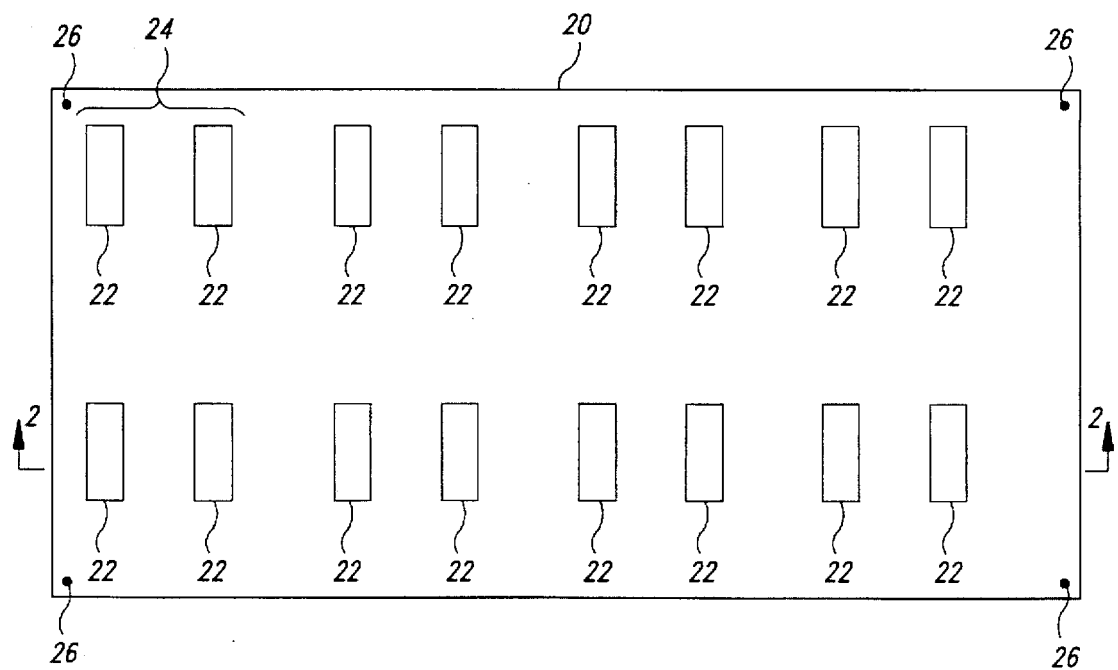
FIG. 1 is a partial bottom plan view of a first stencil of an embodiment in accordance with the invention.

FIG. 1 illustrates a bottom face of first stencil 20 in accordance with a preferred embodiment of the invention for depositing solder or adhesive compounds onto a printed circuit board. The first stencil 20 has a plurality of first openings 22 arranged in a first pattern on the first stencil 20. The first openings 22 are preferably arranged into a pattern with a plurality of opening pairs 24 in which each pair 24 has two spaced apart first openings 22. The size and shape of the first openings 22 are a function of several factors specific to each application, including the types of electrical components that are to be mounted to the PCB, the location on the PCB where the components are to be mounted, and the specific circuitry of the PCB. The first stencil 20 also has alignment fiducials 26 at predetermined locations that are optically distinguishable from the rest of the stencil 20.

The first stencil 20 may be fabricated by cutting holes through a sheet of material with a laser or an etchant to form the openings 22, and half-etching recesses in the sheet to form fiducial recesses. The first stencil 20 may also be molecularly gown by known processes used to fabricate E-FAB stencils. The fiducial recesses are then filled with a material that is optically distinguishable from the rest of the first stencil 20. Suitable materials from which the first stencil 20 may be made include, but are not limited to, stainless steel, molybdenum, titanium, and other metals or hard materials. Suitable materials for fabricating the alignment fiducials 26 include, but are not limited to, carbon black and other materials that are readily detected by optical equipment.

Figure 2:
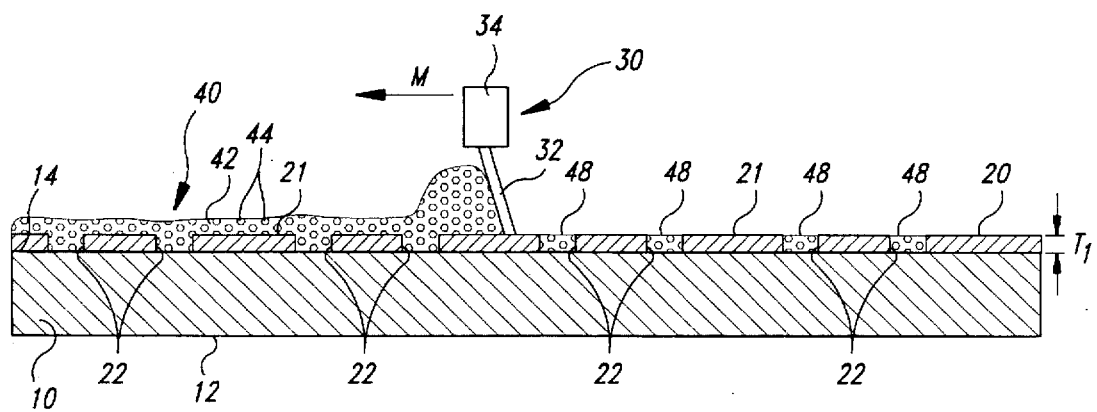
FIG. 2 is a schematic cross-sectional view of a solder compound being deposited onto a printed circuit board through a first stencil of an embodiment in accordance with the invention.

FIG. 2 illustrates a solder paste 40 being deposited through the first stencil 20 and onto a bottom side 14 of a printed circuit board 10. It will be appreciated that the apparatuses and methods disclosed herein may also be used to deposit adhesive materials to a top side 12 of the PCB 10. The first stencil 20 is covered with the solder paste 40 so that the solder paste 40 fills the openings 22. A wiper assembly 30 having an actuator 34 and a blade 32 moves across a top surface 21 of the first stencil 20 in a direction indicated by arrow M. The wiper blade 32 scrapes excess solder paste 40 off of the top surface 21 of the first stencil 20, and presses the remaining solder paste 40 into the openings 22 to form solder pads 48. The first stencil 20 preferably has a thickness of $T_1$ that corresponds to a desired height of the solder pads 48. Thus, as shown in FIG. 3, the first stencil 20 forms a plurality of solder pads 48 on the bottom side 14 of the PCB 10 that have a height $h_1$ approximately equal to the thickness $T_1$ of the first stencil.

The solder paste 40 is preferably an inexpensive, high-strength solder material that has a flux 42 and a plurality of solder spheres 44 dispersed throughout the flux 42. Suitable solder materials include lead and tin alloys, and preferably a 60/30 lead/tin alloy.

Figure 3:
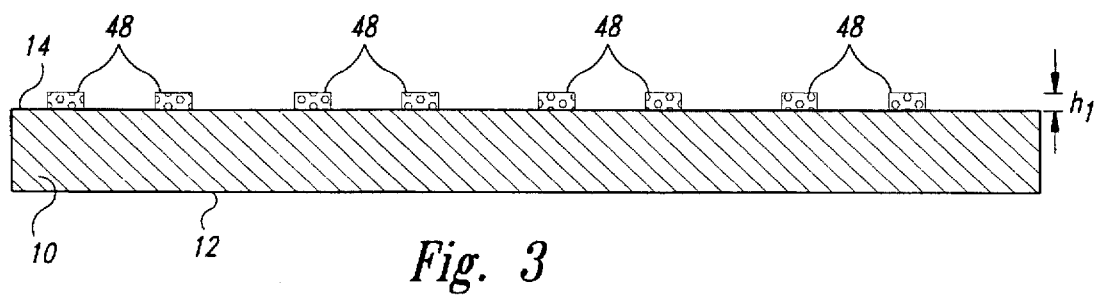
FIG. 3 is a partial schematic cross-sectional view of a plurality of first pads deposited onto a printed circuit board in a first pattern using an embodiment of a method in accordance with the invention.
Figure 4A:
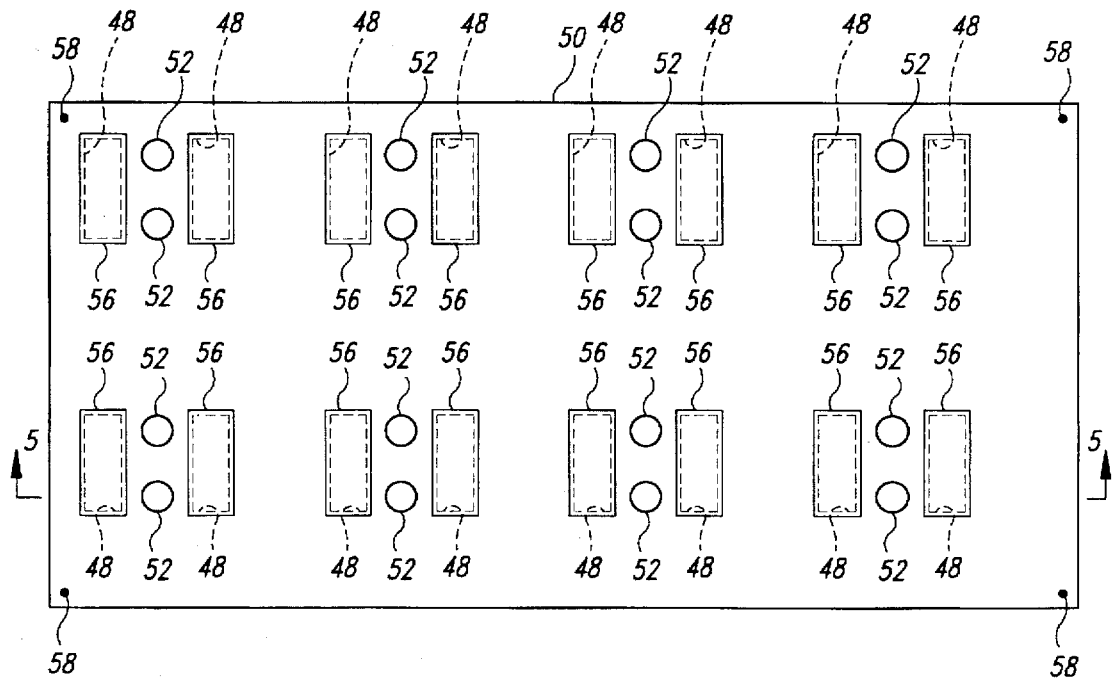
FIG. 4A is a partial bottom plan view of a second stencil of an embodiment in accordance with the invention.

FIG. 4A illustrates a second stencil 50 for depositing a glue or other adhesive onto the PCB 10 (shown in FIG. 3). The second stencil 50 has a plurality of second openings 52 and a plurality of recesses 56. The second openings 52 are arranged in a second pattern based upon the first pattern of solder pads 48 formed with the first stencil 20. For purposes of clarity, the solder pads 48 are shown in phantom to indicate the relationship between the solder pads 48, and the second openings 52 and recesses 56 of the second stencil 50. More specifically, the second openings 52 are arranged so that they are positioned between the two spaced apart solder pads 48 of each pair 24 of solder pads 48. The recesses 56 are arranged on the bottom face of the stencil 50 in the same pattern as the first pattern of solder pads 48. The recesses 56 are also sized and shaped to receive the solder pads 48 without contacting the solder pads 48. The second stencil 50 also includes a number of alignment fiducials 58 for aligning the second stencil with a PCB so that the second openings 52 and the recesses 56 are appropriately positioned with respect to the solder pads 48.

The second stencil 50 may be fabricated by laser cutting the openings 52 through the stencil 50 with a laser or an etchant. As with the first stencil, the second stencil 50 may also be molecularly grown by known processes used to fabricate E-FAB stencils. The recesses 56 may be fabricated by half-etching selected areas on the back face of the stencil 50 to a desired depth. The depth to which the recesses are etched is typically greater than height $h_1$ of the solder pads 48 (shown in FIG. 3) so that the second stencil 50 does not deform the solder pads 48 when it is positioned over the solder pads 48. The second stencil 50 may be made from the same or different materials as that of the first stencil 20. Accordingly, suitable materials from which the second stencil 50 may be made include, but are not limited to, stainless steel, molybdenum, and other hard materials.

Figure 4B:
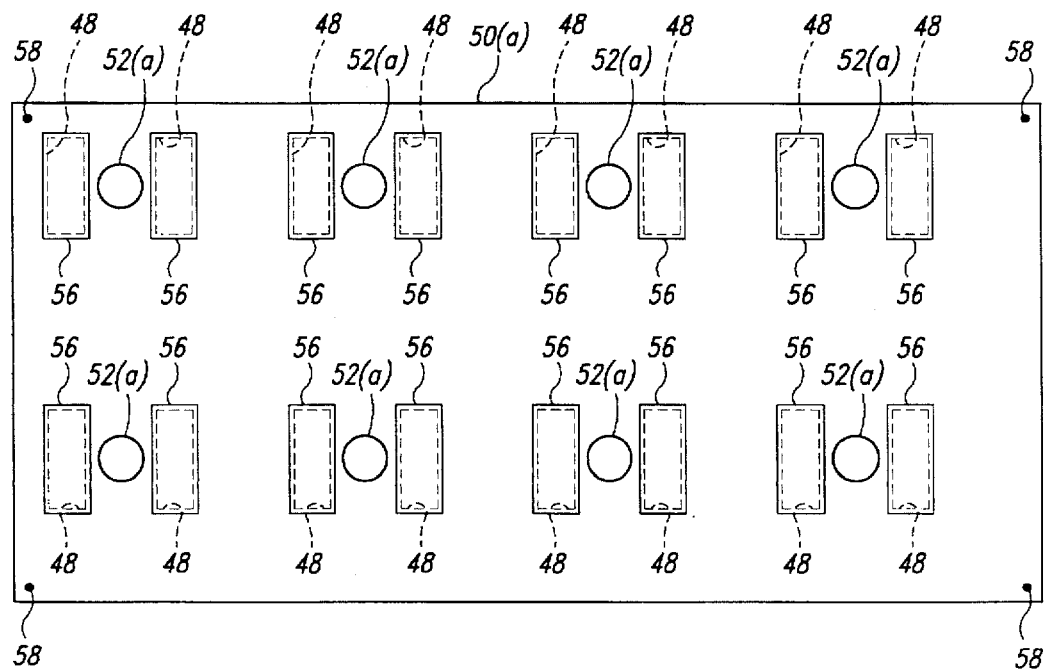
FIG. 4B is a partial bottom plan view of another second stencil of an embodiment in accordance with the invention.
Figure 4C:
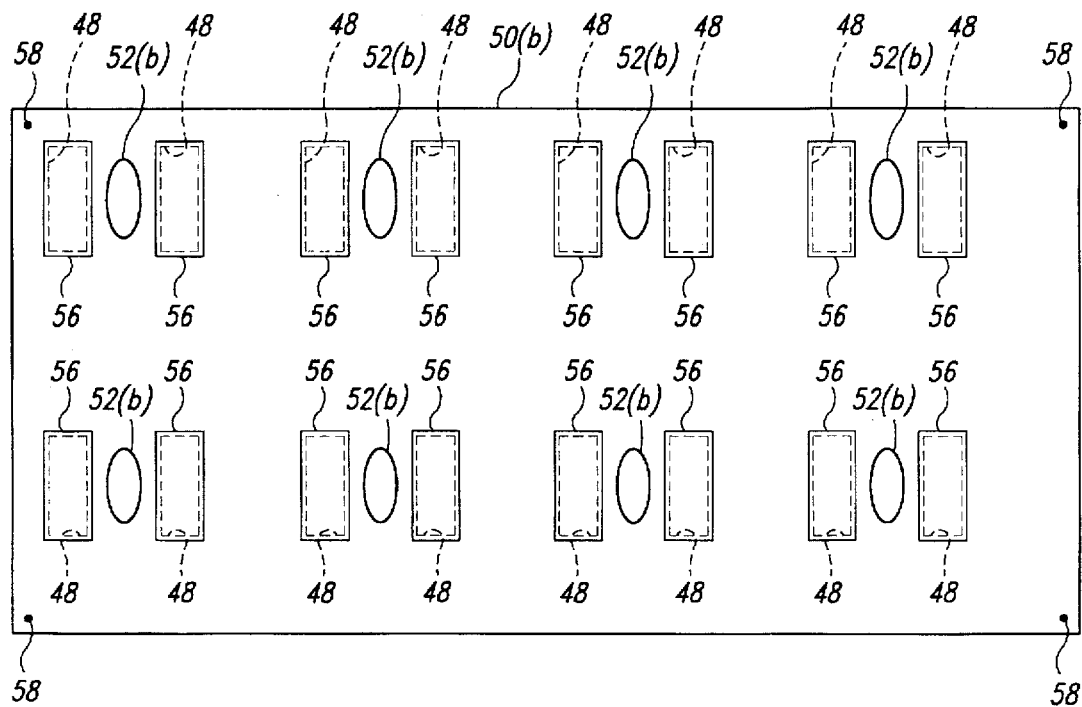
FIG. 4C is a partial bottom plan view of another second stencil of an embodiment in accordance with the invention.
Figure 4D:
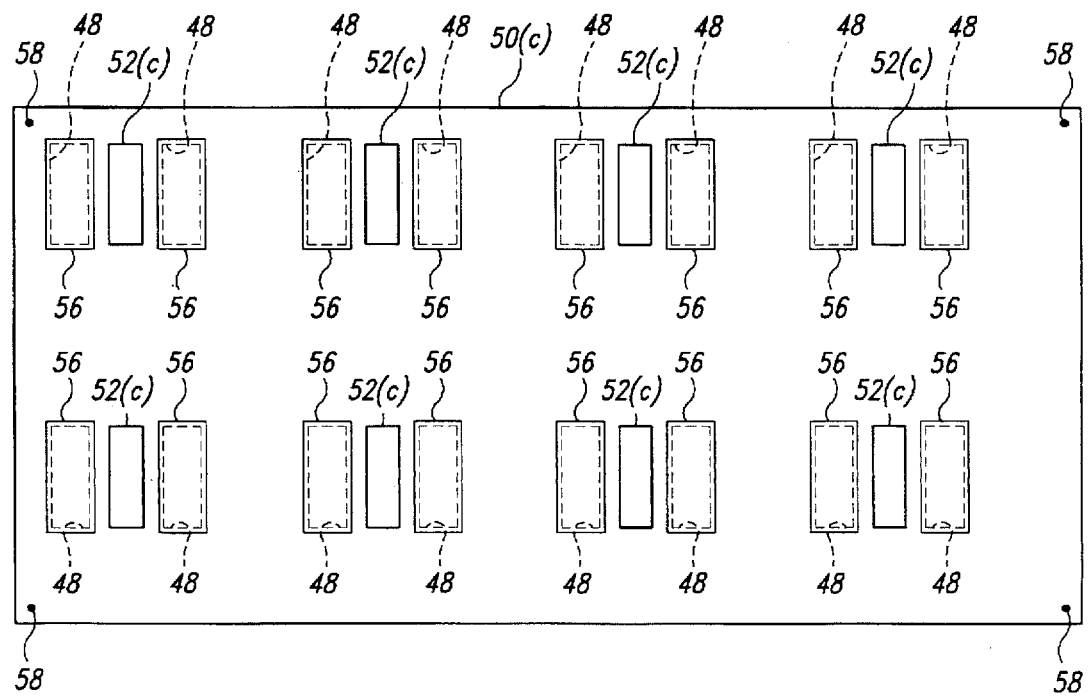
FIG. 4D is a partial bottom plan view of another second stencil of an embodiment in accordance with the invention.

The size and shape of the second openings 52 through the second stencil 50 generally vary from one application to another. In general, the size and shape of the second openings are a function of the spacing between the raised solder features 48 and the quantity of adhesive compound necessary to adequately secure an electrical component to the PCB. FIGS. 4B–4D illustrate other embodiments of second stencils with different sized and shaped second openings. FIG. 4B illustrates a second stencil 50(a) with a pattern of single, large circular second openings 52(a) that have larger diameters than the second openings 52 of FIG. 4A. FIG. 4C illustrates a second stencil 50(b) with a pattern of single elliptical second openings 52(b), and FIG. 4D illustrates a second stencil 50(c) with a pattern of single rectilinear second openings 52(c). The quantities of adhesive compound deposited onto a PCB through the second openings of the second stencils 50(b) and 50(c) are greater than those of the second openings of second stencils 50 and 50(a). It will be appreciated that the size and shape of the second openings are not limited to those disclosed in FIGS. 4A–4D, and may include other suitable sizes and shapes depending upon the particular design of the PCB.

Figure 5:
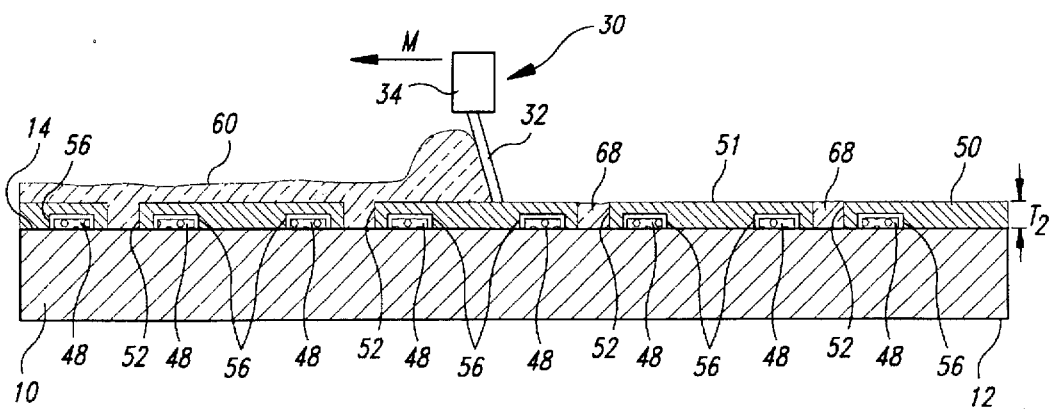
FIG. 5 is a partial schematic cross-sectional view of another adhesive compound being deposited onto a printed circuit board through the second stencil of FIG. 4A.
Figure 6:
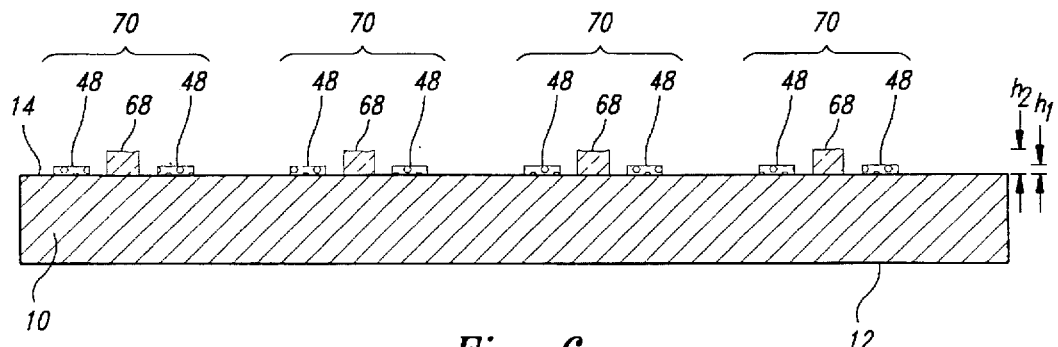
FIG. 6 is a partial schematic cross-sectional view of a plurality of first pads and a plurality of second pads deposited onto a printed circuit board using an embodiment of a method of the invention.

FIG. 5 illustrates an adhesive compound 60 being deposited onto the bottom side 14 of the PCB 10 with the second stencil 50 shown in FIG. 4A. The second stencil 50 is positioned on the bottom side 14 of the PCB 10 so that previously deposited solder pads 48 are positioned in the recesses 56 on the bottom side of the second stencil 50. The second stencil 50 is then covered with the adhesive compound 60 so that the adhesive compound 60 fills the second openings 52 of the second stencil 50. The wiper assembly 30 then moves the blade 32 across a top face 51 of the second stencil 50 to wipe away excess adhesive compound 60 and to form a plurality of glue pads 68 in the second openings 52 of the second stencil 50. The second stencil 50 preferably has a thickness $T_2$ greater than the thickness $T_1$ of the first stencil 20. As shown in FIG. 6, therefore, after the second stencil 50 is removed from the PCB 10, the plurality of glue pads 68 have a height $h_2$ greater than the height $h_1$ of the solder pads 48. Additionally, the solder and glue pads 48 and 68 are preferably grouped together into contact sets 70 in which the glue pads 68 are positioned between the solder pads 48.

In a preferred embodiment, the solder paste 40 is deposited through the first stencil 20 to form the solder pads 48 with a height $h_1$ prior to depositing the adhesive compound 60 through the second stencil 50. Additionally, the adhesive compound 60 is preferably deposited to form glue pads 68 with a height $h_2$ greater than the height $h_1$ of the solder pads 48. Since solder is a relatively non-compressible material compared to most adhesive compounds, it is desirable to deposit the solder prior to other adhesive compounds and to deposit the solder to a lower height than the other adhesive compounds. Otherwise, if the solder and the other adhesive compound are deposited to substantially the same height, the electrical components may not press against the other adhesive compounds with adequate force to sufficiently contact the adhesive compound.

Figure 7:
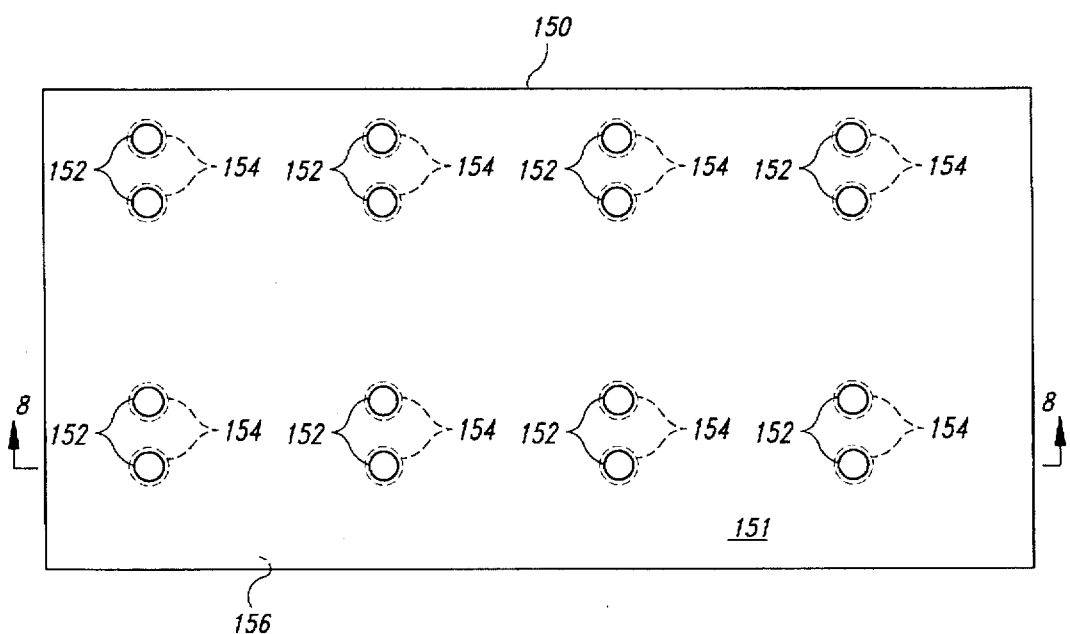
FIG. 7 is a partial top plan view of another second stencil of an embodiment in accordance with the invention.
Figure 8:
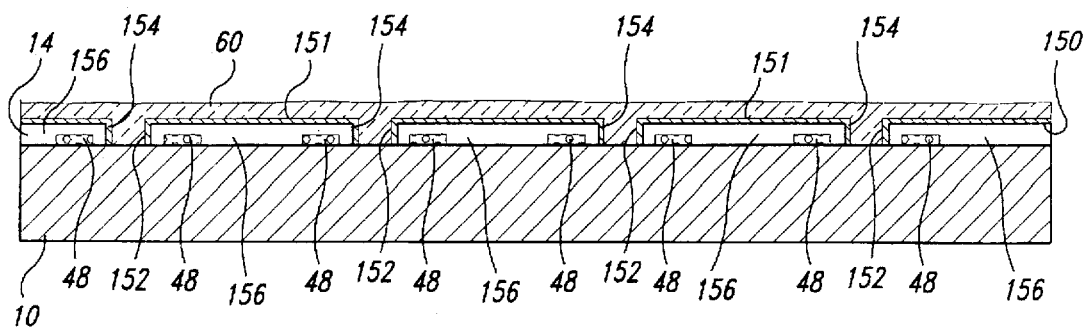
FIG. 8 is a partial schematic cross-sectional view of an adhesive compound begin deposited onto a printed circuit board through the second stencil of FIG. 7.

FIGS. 7 and 8 illustrate another embodiment of a second stencil 150 in accordance with the invention. The second stencil 150 has a top sheet 151 with a plurality of second openings 152 in a second pattern that is based upon the pattern of solder pads 48 previously deposited onto the PCB. A tube 154 is attached to or formed integrally with the sheet 151 at each opening 152 so that a plurality of tubes 154 extend downwardly from the sheet 151. The tubes 154 and the underside of the sheet 151 define a large, continuous cavity 156. As best shown in FIG. 8, the second stencil 150 is positioned over the bottom side 14 of the PCB 10 so that the tubes 154 are positioned between the solder pads 48, and the solder pads 48 are positioned within the cavity 156. The sheet 151 is then covered with an adhesive compound 60, which is removed to form glue pads 68 in the same manner as discussed above with respect to FIG. 5.

Figure 9A:
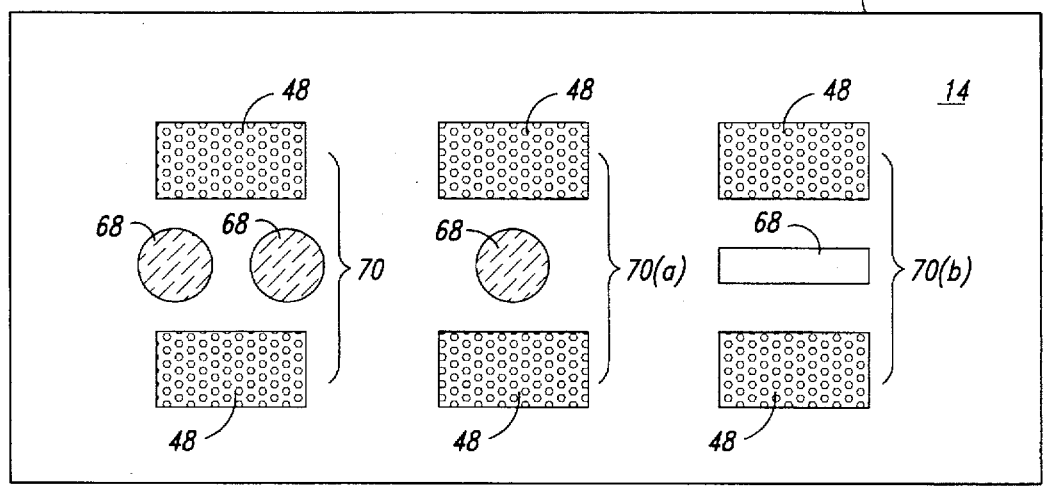
FIG. 9A is a top plan view of various patterns of solder and adhesive pads formed using first and second stencils in accordance with the invention.
Figure 9B:
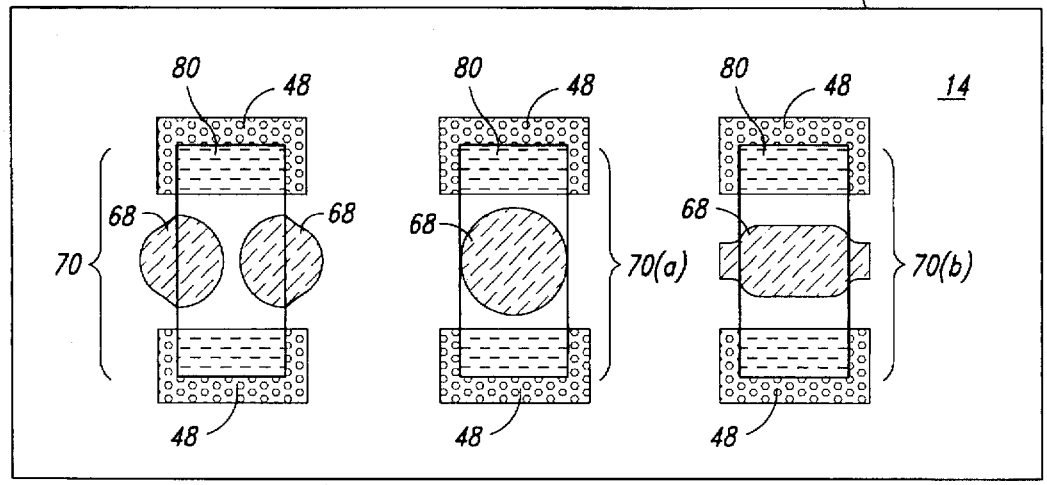
FIG. 9B is a top plan view of electrical components being surface mounted to the PCB on the solder and adhesive pads of FIG. 9A.

FIGS. 9A and 9B illustrate various contact sets of solder pads 48 and glue pads 68 before and after electrical components are surface mounted to the PCB 10. The solder and glue pads 48 and 68 of contact set 70 are formed by the first stencil 20 and the second stencil 50 (shown in FIGS. 1 and 4A). The solder and glue pads 48 and 68 of contact set 70(a) are formed by the first stencil 20 and the second stencil 50(a) (shown in FIGS. 1 and 4B). The solder and glue pads 48 and 68 of contact set 70(b) are formed by the first stencil 20 and the second stencil 50(c) (shown in FIGS. 1 and 4D). As shown in FIG. 9B, electrical components 80 are surface mounted to the bottom side 14 of the PCB 10 by simply pressing the electrical components 80 against the contact sets 70, 70(a) and 70(b). The solder pads 48 and the glue pads 68 deform under the force of the electrical components 80 and bond the electrical components 80 to the bottom side 14 of the PCB 10.

One advantage of the present invention is that it increases the throughput of PCB assembling processes. Compared to conventional solder/glue deposition processes that use a syringe to deposit the glue compound onto the PCB, the present invention is much faster and generally more accurate because it deposits both the solder and the glue with stencils. Prior to the present invention, however, it has not been known to deposit the adhesive compound onto the PCB with a stencil after the solder paste has been deposited onto the PCB without destroying the pattern of previously deposited solder pads. The present invention allows both the solder and glue compounds to be deposited with stencils because it provides a second stencil with recesses that receives the previously deposited solder pads.

Another advantage of the present invention is that it provides better control of the quantity of adhesive compound that may be deposited onto the PCB in the space between each pair of solder pads. Conventional syringe depositing devices deposit a hemispherical raised adhesive feature between each pair of solder pads. Accordingly, the volume of adhesive deposited with a syringe is limited by the maximum diameter of the hemisphere between the solder pads. With the present invention, however, more of the surface area between the solder pads may be covered with an adhesive compound because the second openings through the second stencil may be shaped and sized to cover more of the space between the solder pads with glue. Additionally, the height of the adhesive compound may be increased by increasing the thickness of the second stencil. Therefore, more adhesive compound may be deposited into the same space using the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A solder paste and adhesive dispenser that deposits solder paste pads and adhesive pads onto a printed circuit board for surface mounting electrical components to the printed circuit board, comprising:
   a first stencil having a first thickness of a desired solder pad thickness and a plurality of first openings through which a solder paste is deposited onto the printed circuit board to form a plurality of first pads of solder paste on the printed circuit board in a first pattern; and
   a second stencil having a second thickness of a desired adhesive thickness, a plurality of second openings, and at least one recess in a bottom face of the second stencil configured to receive the plurality of first pads when the second stencil is positioned on the board, wherein the second openings are arranged in a second pattern with respect to the first openings so that an adhesive material deposited onto the printed circuit board through the second opening forms a plurality of second pads of adhesive on the board in the second pattern.

2. The device of claim 1 wherein the first thickness is less than the second thickness so that the first pads of solder paste have a height less than the second pads of adhesive.

3. The device of claim 1 wherein the first openings are circular.

4. The device of claim 1 wherein the first openings are rectilinear.

5. The device of claim 1 wherein the second openings are circular.

6. The device of claim 1 wherein the second openings are rectilinear.

7. The device of claim 1 wherein the second stencil comprises a sheet having a top face and a bottom face through which the second openings extend and a plurality of tubes extending downwardly from the bottom face of the sheet at each second opening, and wherein the at least one recess is a cavity defined by the bottom face of the sheet and the tubes.

8. The device of claim 1 wherein the second stencil comprises a plate having a top face and a bottom face through which the second openings extend, and wherein the at least one recess comprises a plurality of recesses in the bottom face of the plate, each recess being configured and positioned with respect to the first openings of the first stencil to receive at least one first adhesive pad when the second stencil is positioned on the board.

9. The device of claim 1 wherein the first pattern has a plurality of pairs of two spaced apart first openings to deposit pairs of positive and negative solder pads, and the second pattern has at least one second opening positioned to deposit the second material between each positive and negative solder pad of the pairs of positive and negative solder pads.

10. The device of claim 9 wherein the two spaced apart openings of each pair of first openings are rectilinear and the at least one second opening of the second pattern is circular.

11. The device of claim 9 wherein the two spaced apart openings of each pair of first openings are rectilinear and the at least one second opening of the second pattern is rectilinear.

12. The device of claim 9 wherein the two spaced apart openings of each pair of first openings are rectilinear and the at least one second opening of the second pattern is elliptical.

13. The device of claim 9 wherein the at least one second opening comprises a plurality of second openings.

14. A solder paste and adhesive dispenser with a printed circuit board holder and a wiper assembly, the wiper assembly having an actuator and a blade attached to the actuator to separately deposit solder paste pads and adhesive pads on the printed circuit board as the wiper assemble translates the blade, comprising:
   a first stencil adapted to be attached to the dispenser, stencil having a thickness $T_1$ and a plurality of first openings arranged in a first pattern, and the first stencil being engageable with the blade to deposit solder paste pads on the printed circuit board with a height $h_1$ approximate to the thickness $T_1$; and
   a second stencil adapted to be attached to the dispenser, the second stencil having a thickness $T_2$ greater than $T_1$, a plurality of recesses arranged in the first pattern, and a plurality of second openings, the plurality of recesses further having shapes corresponding to the first openings and a depth D which is at least as great as the thickness $T_1$, and the second stencil being engageable with the blade to deposit adhesive pads on the printed circuit board with a height $h_2$ approximate to the thickness $T_2$.

15. The device of claim 14 wherein the second openings are arranged in a second pattern in which the second openings are misaligned with respect to the first openings.

16. The device of claim 15 wherein the first pattern has a plurality of pairs of two spaced apart first openings to deposit pairs of positive and negative solder pads onto a printed circuit board, and the second pattern has at least one second opening positioned to deposit the second material between each positive and negative solder pad of the pairs of solder pads.

17. The device of claim 16 wherein the two spaced apart openings of each pair of first openings are rectilinear and the at least one second opening of the second pattern is circular.

18. The device of claim 16 wherein the two spaced apart openings of each pair of first openings are rectilinear and the at least one second opening of the second pattern is rectilinear.

19. The device of claim 16 wherein the two spaced apart openings of each pair of first openings are rectilinear and the at least one second opening of the second pattern is elliptical.

20. The device of claim 16 wherein the at least on second opening comprises a plurality of second openings.

* * * * *